United States Patent [19]

Shearer et al.

[11] Patent Number: 4,893,030

[45] Date of Patent: Jan. 9, 1990

[54] BIASING CIRCUIT FOR GENERATING PRECISE CURRENTS IN AN INTEGRATED CIRCUIT

[75] Inventors: Gerald W. Shearer, Orange; Karl M. J. Lofgren, Long Beach; Kenneth W. Ouyang, Huntington Beach, all of Calif.

[73] Assignee: Western Digital Corporation, Irvine, Calif.

[21] Appl. No.: 233,847

[22] Filed: Aug. 16, 1988

Related U.S. Application Data

[63] Continuation of Ser. No. 937,983, Dec. 4, 1986, abandoned.

[51] Int. Cl.$^4$ .................................................. G05F 1/56
[52] U.S. Cl. .............................. 307/296.8; 307/296.7; 323/315
[58] Field of Search ................... 307/296 R, 297, 494, 307/496, 497, 246; 323/315–316; 330/253, 257

[56] References Cited

U.S. PATENT DOCUMENTS

| | | | |
|---|---|---|---|
| 4,300,091 | 11/1981 | Schade, Jr. | 307/297 X |
| 4,388,539 | 6/1983 | Boeke | 307/497 X |
| 4,446,419 | 5/1984 | vande Plassche et al. | 330/257 X |
| 4,453,094 | 6/1984 | Peil et al. | 307/297 X |
| 4,523,150 | 6/1985 | Hogeboom | 307/246 X |
| 4,602,207 | 7/1986 | Kim et al. | 307/296 R |
| 4,629,973 | 12/1986 | Voorman | 323/316 |
| 4,642,551 | 2/1987 | Miller | 330/257 X |
| 4,647,841 | 3/1987 | Miller | 323/316 |

FOREIGN PATENT DOCUMENTS 0131340 3/1985 United Kingdom .

OTHER PUBLICATIONS

Millman & Halkias, Integrated Electronics: Analog and Digital Circuits and Systems, pub. by McGraw-Hill, Inc., New York, 1972, pp. 501–504.

Primary Examiner—David Hudspeth
Attorney, Agent, or Firm—Spensley Horn Jubas & Lubitz

[57] ABSTRACT

An integrated circuit chip is fabricated with an operational active device and a nearly-identical, exemplary active device. The exemplary device is connected in series with a current reference element so that current flow through the reference element will be substantially duplicated in the exemplary device. A difference amplifier senses the output voltage of the exemplary device; compares it to a provided reference voltage; and generates a gate biasing level at the gate of the exemplary device to force the output voltage of the exemplary device substantially equal to the reference voltage. The biasing level at the gate of the exemplary device is duplicated at the gate of the operational device thereby creating a condition wherein the output current of the operational device will be a substantially precise replica of the current flow through the reference element when the reference voltage is duplicated across the output of the operational device.

36 Claims, 7 Drawing Sheets

BIASING CIRCUIT FOR GENERATING PRECISE CURRENTS IN AN INTEGRATED CIRCUIT

This is a continuation of copending application Ser. No. 937,983 filed on Dec. 4, 1986, now abandoned.

BACKGROUND OF THE INVENTION

1. Field of the Invention

The present invention relates generally to the problem of manufacturing integrated circuits having consistent operating characteristics from one manufacturing batch to the next. More specifically, it relates to the problem of manufacturing precise currents in individual ones of a plurality of bulk fabricated integrated circuits.

2. Description of the Prior Art

Complex electronic circuits may be manufactured in bulk volume at low cost using known integrated circuit fabrication techniques. In these techniques, n-type and p-type conductivity regions are formed one next to the other in a semiconductor substrate such as the substrate 100 shown in FIG. 1. Any alternating arrangement of three or more such regions (PNP or NPN) may be used to create various transistor devices. The P and N regions are typically created by diffusing various impurities (doping agents) through a top surface of the substrate. Top surface dimensions (width and length) of the regions can be controlled to precise tolerances using known photolithographic methods. In cost-effective production techniques it is difficult to keep the depth of the regions within precise tolerances due to process variations (i.e., changes in furnace temperature and impurity concentration levels). This means that transistors from one process batch cannot be guaranteed to be identical to those of another batch.

Within a single batch, wafer, or IC (integrated circuit) chip however, the depth of similar regions will remain generally consistent because integrally formed regions are fabricated under almost identical process conditions. Identical or nearly-identical transistors, resistors, etc. can be formed on individual IC chips. The identical nature of such devices may be exploited to form precision voltage dividers and current splitters. Voltage and/or current magnitudes produced by such precision dividers (or splitters) are precise only in a relative sense. They remain consistently determinable from one manufacturing batch to the next, relative to other voltage or current levels developed internally on the IC chip but not to absolute levels developed outside the chip. Disparities among the absolute output magnitudes of voltages and currents generated by IC's from different fabrication batches create an undesirable situation in which it is difficult to obtain consistent operating characteristics from bulk-produced IC systems.

In FIG. 1, three active devices (transistors) labeled $Q_1$, $Q_2$, and $Q_3$ are shown in sectional perspective with a top layer 110, comprised of metal contacts and insulated gates, exploded away from the top surface of the substrate 100 to reveal a plurality of P and N regions forming the active devices, $Q_1$, $Q_2$, and $Q_3$. The first and second devices, $Q_1$ and $Q_2$, comprise a sequence of nearly-identical NPN regions. The third device, $Q_3$, is fabricated of a dissimilar sequence of PNP regions. Active devices such as NPN bipolar transistors, n-channel FETs (field effect transistors), and the like can be manufactured using the NPN sequences of $Q_1$ and $Q_2$. Complementary (dissimilar) active devices such as PNP bipolar transistors, p-channel FET's and the like may be fabricated from the PNP sequence of regions forming $Q_3$. In FIG. 1, the first and second active devices, $Q_1$ and $Q_2$, are shown to be formed as metal-oxide-semiconductor field-effect-transistors (MOSFETs) having respective source, gate and drain terminal portions $S_1$, $G_1$, $D_1$, $S_2$, $G_2$, and $D_2$. The terminal portions are contained within the exploded upper layer 110. It is to be assumed that the dissimilar device, $Q_3$, has a respective source terminal $S_3$, gate terminal $G_3$ and drain terminal $D_3$ associated with its PNP regions (not shown in FIG. 1).

The n-type regions of the nearly-identical (twin) first and second devices, $Q_1$ and $Q_2$, are formed with an identical diffusion depth $D_{f1}$. Each of the twin devices has associated therewith a channel length L (distance between source and drain regions) and a channel width W. The width/length dimensions may be formed within precise tolerances as previously mentioned, using known photolithographic techniques. When the respective widths, $W_1$ and $W_2$, and the respective lengths, $L_1$ and $L_2$, of two twin devices such as $Q_1$ and $Q_2$ are identical, the twin devices will be referred to herein as identical twins. Identical twins possess identical electrical characteristics. That is, if identical output voltages, $V_{DS1}$ and $V_{DS2}$ are developed across the drain and source terminals of two identical-twin devices and equal gate voltages $V_{GS1}$, $V_{GS2}$ are applied at their gate terminals, then substantially identical currents, $I_{DS1}$ and $I_{DS2}$ will flow through the output terminals (drain and source terminals) of such devices. This happens because the operating temperatures and fabrication process variables affecting the operating characteristics of two such devices on the same chip are substantially equal. If all factors except the channel widths and channel lengths of two twin devices remain identical, the output currents of the two twin devices will be proportional replicas of one another where the proportionality factor (scaling multipler) is determined by the top view dimensions of the respective devices.

The p-type regions of the third device, $Q_3$ (PNP) diffuse to a depth $D_{f3}$, below the substrate surface, that in general is effectively different from the depth $D_{f1}$ of the NPN regions such that it becomes difficult to ascertain any precise relationship between the operating characteristics of $Q_3$ and those of the twin devices, $Q_1$ and $Q_2$. This presents a problem when complementary devices such as the n-channel FET, $Q_2$ and p-channel FET, $Q_3$ are to be used in conjunction (e.g., CMOS circuits) to drive an output element that requires precise drive currents.

FIG. 2 is a graph of typical device operating characteristics showing the relationship between an output current $I_D$ of a generic active device Q (FIG. 4) and output and bias voltages, $V_D$ and $V_B$, across the device. The magnitude of the output current $I_D$ is a function of not only the applied voltages, $V_D$ and $V_B$, but also of other factors such as the operating temperature, fabrication process variables, and the dimensions of various p-type and n-type regions.

FIG. 3 shows a number of schematic symbols typically used to represent dissimilar active devices. Devices such as an n-channel FET and an NPN bipolar transistor may be formed from regions having an NPN arrangement. Devices such as a p-channel FET and a PNP bipolar transistor may be fabricated at substrate areas having a PNP sequence of regions. Such active devices are represented by the generic circular symbol shown in FIG. 4.

FIG. 4 is a schematic diagram showing one of many possible applications wherein the absolute magnitude of an output current $I_D$ from an active device Q may be of importance. The active device Q is illustrated generically as having a current-controlling gate terminal G, a first output terminal $O_1$ and a second output terminal $O_2$. A bias level $V_B$ is applied to the gate terminal G for a time duration t through a switch SW. The output terminals, $O_1$ and $O_2$, are placed in series between a voltage source $V_{cc}$ and a charge accumulating (integrating) capacitor C. When the switch SW is closed for the time duration t, an output current $I_D$ of a specific magnitude is pumped into the integrating capacitor C from the active device Q. An integrated voltage $V_C$ develops across the capacitor C as a result of the total charge stored therein. The voltage change $V_C$ resulting from the charge pumped into the capacitor by the output current $I_D$ is proportional to a product of the absolute value of the output current magnitude $I_D$ and the application time duration t. It may be expressed formally as:

$$\Delta V_C = I_D \cdot t / C$$

where C is the value of the capacitor expressed in farads. The voltage $V_C$ across the charge integrating capacitor C is often used to trigger timing circuits in electronic systems. For applications where the timing must be very precise, it is desirable that the magnitude of the device output current $I_D$ be predictable within precise tolerances. It is difficult however to assure that the output current $I_D$ of each current controlling device Q in every one of a large number of integrated circuit chips (IC's) will be within a desirable set of tolerances. Magnitude determinitive factors such as the operating temperature of each individual IC and fabrication process variables affecting the operating characteristics of each active device on a chip have to be accounted for.

SUMMARY OF THE INVENTION

It is an object of the present invention to maintain an output current of an active device on an integrated circuit within a precise set of tolerances. It is another object of the present invention to provide a cost effective means for assuring the precision of an output current produced by an active device when the device is part of an integrated circuit chip (IC) which is manufactured in bulk volume.

The above objectives are realized in accordance with the present invention by providing a biasing circuit which includes an exemplary active device on an integrated circuit that is connected in series with a current reference element. The exemplary device has a gate terminal to which a current-controlling bias may be applied and a pair of output terminals from which a gate-controlled output current flows. At least one operating device that is nearly-identical to the exemplary device is provided on the integrated circuit in a manner such that the operating characteristics of the two devices are nearly-identical irrespective of operating temperature and fabrication process variables. The exemplary device and current reference element are arranged such that the magnitude of an output current flow through the exemplary device is precisely determinable from (e.g. substantially equal to) the current flow through the current reference element. The output voltage across the exemplary device is forced to a desired voltage by means of a gate controller. The gate controller senses the output voltage of the exemplary device, compares the sensed output voltage to the desired voltage and applies a biasing level to the gate of the exemplary device to drive the output voltage of the exemplary device toward the desired voltage. The biasing level applied to the gate of the exemplary device is duplicated at the gate of the nearly-identical operating device. The output current of the operating device will be precisely determinable from the current flow through the current reference element when the output voltage across the operating device is equal to the output voltage of the exemplary device (which in turn is equal to or almost equal to the desired voltage).

Cost effective tolerance control is realized by fabricating the current reference element separately from the active devices of the IC.

DETAILED DESCRIPTION

Figure 5:
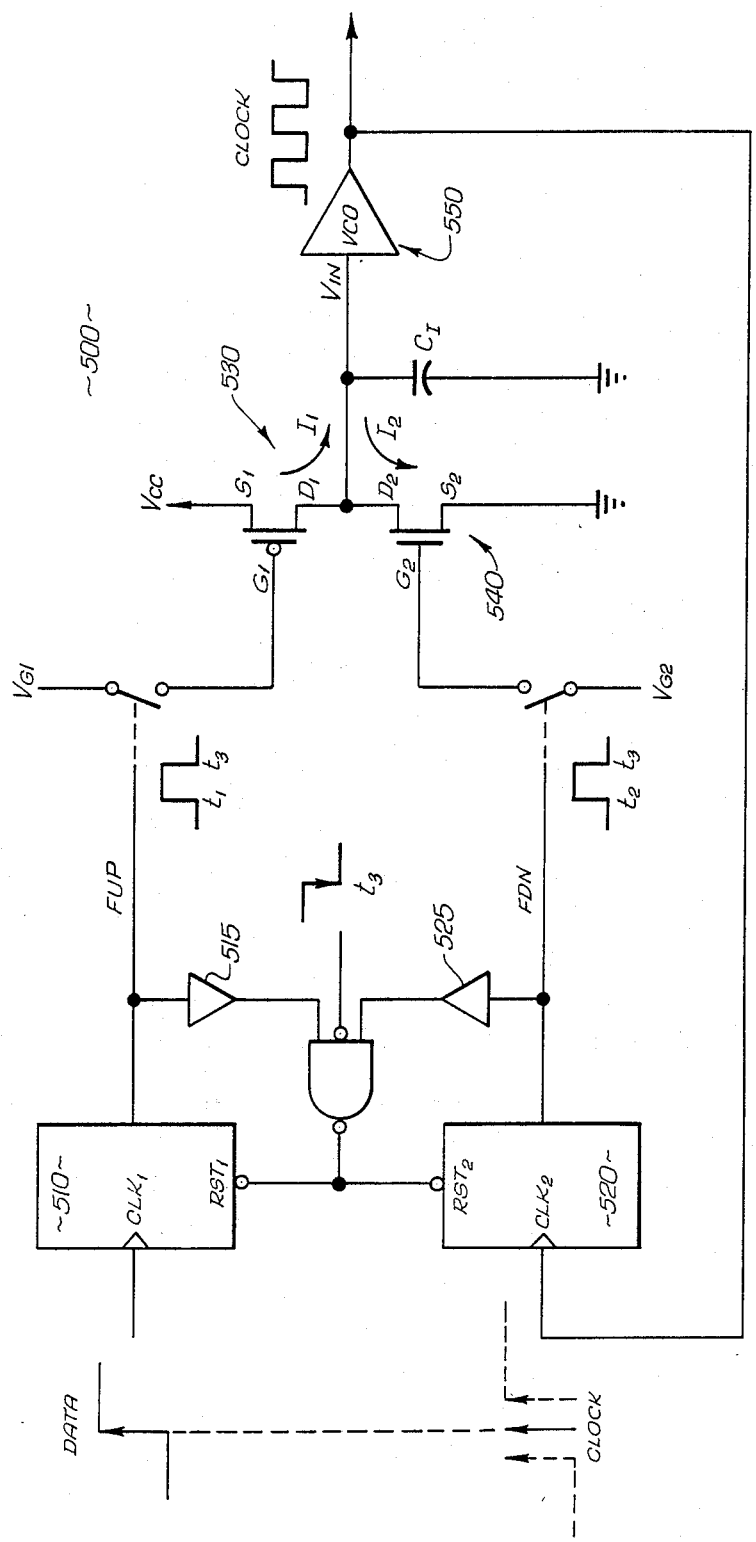
FIG. 5 is a schematic diagram of a phase locking system to which the present invention may be applied.

The present invention provides a cost-effective technique for controlling the magnitude of an output current that is produced as an output of an active device in an integrated circuit. The benefits derived from the ability to precisely control the magnitude of the output current of one or more active devices on an integrated circuit chip are too numerous to be discussed generally herein. FIG. 5 is a schematic diagram of a specific phase-locking system 500 for which the present invention was developed. The phase-locking system 500 generates a CLOCK signal which is intended to be phase matched with an incoming asynchronous DATA signal. The DATA signal could be derived for example, from a rotating floppy disc of a computer. In the phase-locking system 500, the DATA signal is applied to a clock input of a first flip flop 510. The phase-locking system 500 includes a voltage controlled oscillator (VCO) 550 which outputs a CLOCK signal having a predetermined frequency. The CLOCK signal is applied to a second flip-flop 520. Rising edges of the CLOCK signal cause a frequency-decrementing output, FDN of the second flip-flop 520 to go high for a short period of time $t_3 - t_2$. Rising edges of the DATA signal cause a frequency-incrementing output FUP of the first flip-flop 510 to go high for a short duration $t_3 - t_1$. The frequency incrementing/decrementing signals, FUP and FDN, pass through a set of time delay gates, 515 and 525, to reset the outputs of the flip-flops 510, 520 at a mutual time $t_3$. If a rising edge of the DATA signal arrives at the first flip-flop 510 before a corresponding edge of the CLOCK signal arrives at the second flip-flop 520, the duration $t_3-t_1$ of the FUP signal will be greater than the duration $t_3-t_2$ of the FDN signal. Conversely, if the CLOCK signal edge arrives before a corresponding edge of the DATA signal, the duration $t_3-t_2$ of the FDN signal will be greater. The FUP signal activates a p-channel FET 530 which supplies a first current (source current) $I_1$ to an error integrating capacitor $C_I$. The FDN signal activates an n-channel FET 540 which withdraws a second current (sink current) $I_2$ from the error integrating capacitor $C_I$. The integrating capacitor $C_I$ is coupled to an input of the VCO 550 to apply an input voltage $V_{in}$ thereat. The input voltage $V_{in}$ of the VCO 550 is altered in accordance with the formula:

$$\Delta V_{in}=I_1\cdot(t_3-t_1)-I_2\cdot(t_3-t_2)$$

When the CLOCK signal is precisely in phase with the DATA signal, the input voltage $V_{in}$ of the VCO 550 should preferably remain constant. An accumulating error will be introduced into the locking operation of the phase-locking system 500 if the source and sink currents, $I_1$ and $I_2$, are not precisely the same in magnitude when $t_1=t_2$.

As discussed earlier, the absolute magnitudes of the respective output currents, $I_1$ and $I_2$, of the p-channel FET 530 and its complementary n-channel FET 540 can be affected by numerous factors including the bias voltages applied at the gate terminals of each device, the output voltages developed across the output terminals of the devices, the temperature at which the circuit is operated, and fabrication process variables. The last two factors are the least predictable and most difficult to control. Fortunately, within any single chip, temperature and process variation factors are constant for nearly-identical active devices. This concept is exploited by the present invention to produce equivalent or scaled replicas of a reference current $I_o$ flowing through a reference element in nearly-identical active devices of an IC chip. Moreover, precision replicas of the reference current can also be reproduced in dissimilar devices of the IC chip in accordance with the present invention.

Figure 1:
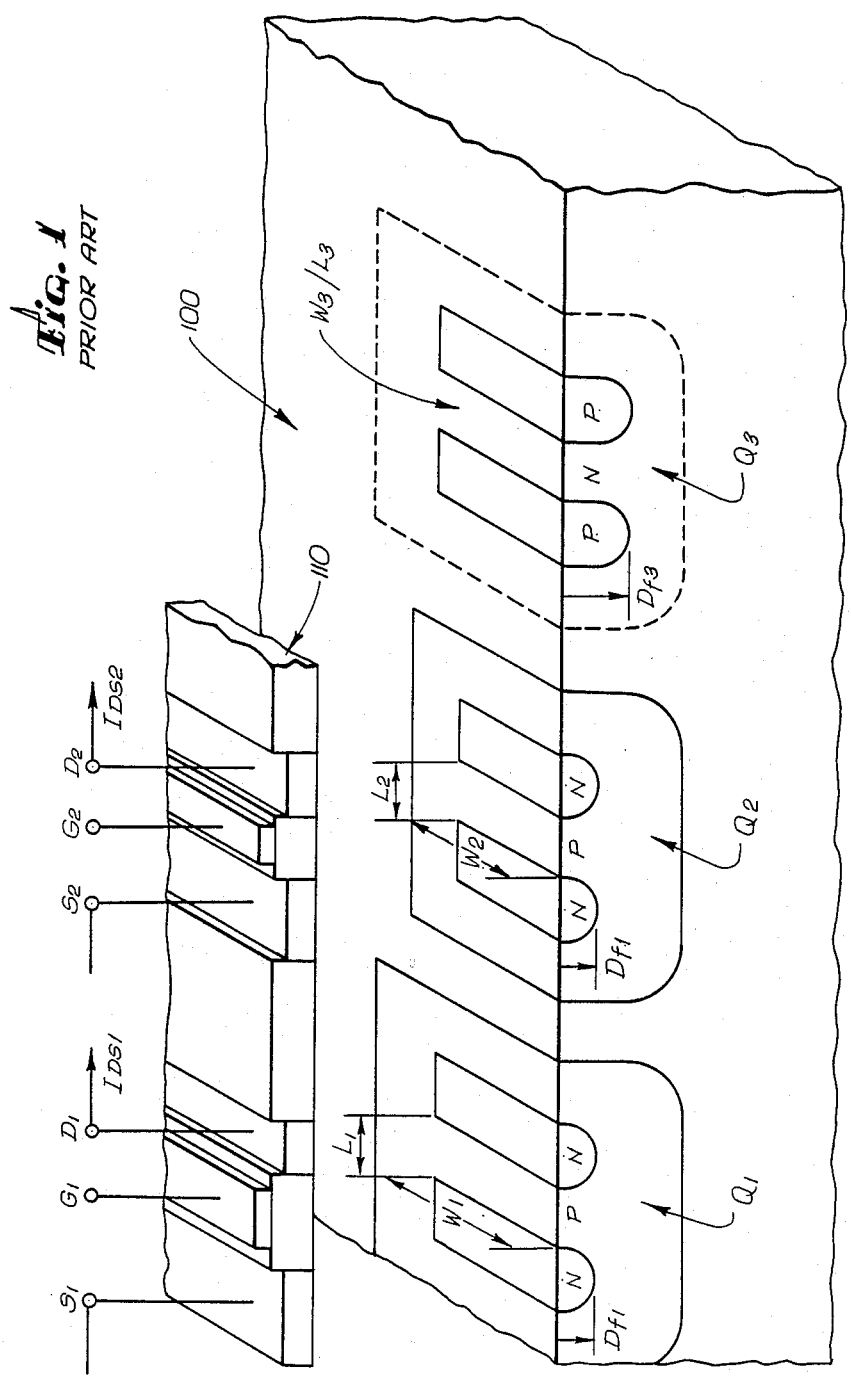
FIG. 1 is a perspective view of portions of an integrated circuit with a top layer exploded away.

Referring back to FIG. 1, it can be said that the NPN devices, $Q_1$ and $Q_2$ are almost identical twins but for their difference in top view dimensions ($W_1/L_1 \neq W_2/L_2$). If the width/length dimensions are made equal, then $Q_1$ and $Q_2$ could be considered identical twins with respect to their electrical operating characteristics. That is, when the same output voltage occurs across their respective output terminals ($V_{DS1}=V_{DS2}$) and the same bias voltage is applied at their gate terminals ($V_{GS1}=V_{GS2}$) then their output currents will be of identical magnitude ($I_{DS1}=I_{DS2}$). Even when the width/length dimensions of the twin devices, $Q_1$ and $Q_2$, are different; a porportional current relationship $I_{DS2}=(W_2/L_2)\cdot(L_1/W_1)\cdot I_{DS1}$ remains generally true when the bias and output voltages of the devices are equal.

Figure 6:
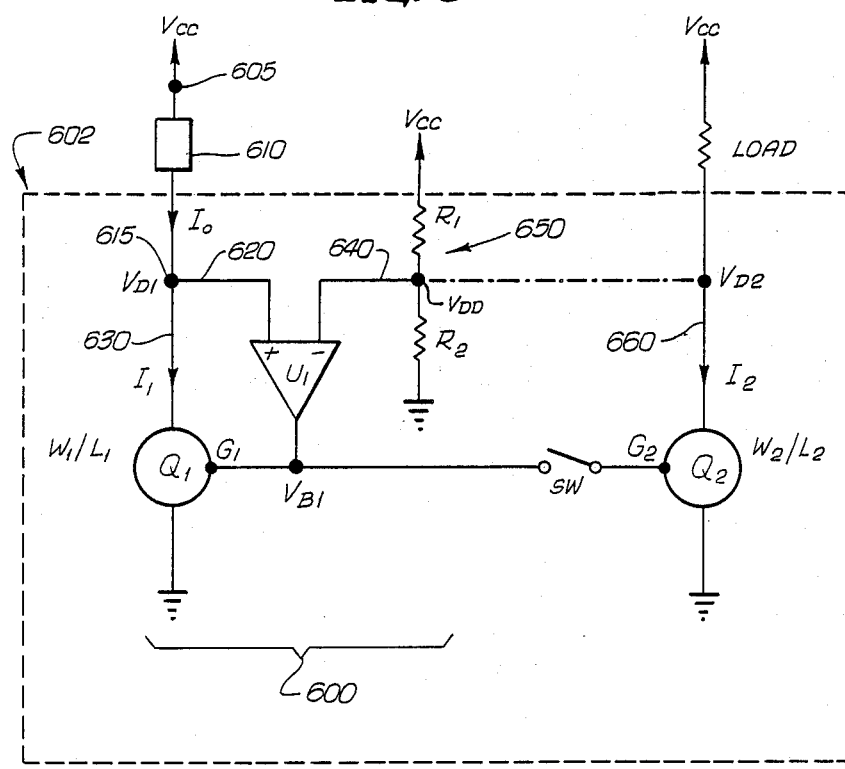
FIG. 6 illustrates a first biasing circuit in accordance with the present invention.

FIG. 6 is a schematic diagram of a first biasing circuit 600 in accordance with the present invention. $Q_1$ and $Q_2$ are "twin" active devices formed on a common semiconductor substrate (IC chip) 602. $Q_1$ is referred to herein as an exemplary active device because its operating characteristics are repeated consistently throughout the integrated circuit chip in similar "twin" devices such as $Q_2$. $Q_2$ is referred to as an operating device. The output terminals of the exemplary device $Q_1$ are placed in series with a current reference element 610 such that the magnitude of an output current $I_1$ flowing through the output terminals of the exemplary device $Q_1$ will be precisely predictable, independent of temperature and process variations, once a reference current $I_o$ through the reference element 610 is known. In the illustrated biasing circuit 600, the output current $I_1$ of the exemplary device $Q_1$ is substantially equal to the reference current $I_0$ flowing through the current reference element 610 by virtue of Kirchhoff's current law. Little or no current flows into an input terminal 620 of a differential amplifier $U_1$ that is coupled to one of the output terminals of the exemplary device $Q_1$. A desired voltage $V_{DD}$ is produced by a voltage source 650. The voltage source 650 is preferably a precision voltage divider which is formed integrally on the IC chip 602 and connected between ground and a supply voltage $V_{cc}$ of the chip. In one variation, the voltage source 650 could include a direct coupling (indicated by the chained line in FIG. 6) to the output voltage $V_{D2}$ of the operating device $Q_2$. The output voltage $V_{D1}$ of the exemplary device $Q_1$ is forced equal to the desired voltage $V_{DD}$ by means of the difference amplifier $U_1$. The difference amplifier $U_1$ has a pair of voltage sensing inputs, one of which (620) is tied to an output terminal of the exemplary device $Q_1$ and the other of which (640) is connected to the desired voltage $V_{DD}$ produced by the voltage source 650. The output of the difference amplifier $U_1$ is coupled to a gate terminal $G_1$ of the exemplary device $Q_1$. The difference amplifier $U_1$ produces a gate biasing level $V_{B1}$ at the gate terminal $G_1$ of the exemplary device. The exemplary device $Q_1$ and the difference amplifier $U_1$ together form a voltage-mirroring feedback loop which forces the output voltage $V_{D1}$ of the exemplary device to be substantially equal to the desired voltage $V_{DD}$. Since the output current $I_1$ of the exemplary device $Q_1$ is known to be substantially equal to the reference current $I_0$, and the output voltage $V_{D1}$ is known to be substantially equal to the desired voltage $V_{DD}$, it can be stated that the gate biasing level $V_{G2}$ required for replicating the current $I_1$ in a nearly-identical device ($Q_2$) will be substantially equal to the developed biasing level $V_{B1}$ at the gate terminal $G_1$ of the exemplary device $Q_1$. If this same biasing level $V_{B1}$ is duplicated at a second gate terminal $G_2$ of the "twin" active device $Q_2$ when the output voltage $V_{D2}$ across the twin device $Q_2$ is equal to the desired voltage $V_{DD}$, then the output current $I_2$ through the twin device will be known to be $I_2=(W_2/L_2)\cdot(L_1/W_1)\cdot I_1$. In other words, the output current $I_2$ will be a scaled replica of the exemplary device current $I_1$ and the precision of $I_1$ will be duplicated in $I_2$ (even if the magnitude of $I_2$ is scaled up or down by a precisely determinable proportionality factor). As mentioned, the desired voltage $V_{DD}$ can be made equal to the output voltage $V_{D2}$ of the twin device $Q_2$ simply by connecting the appropriate input terminal 640 of the difference amplifier $U_1$ to an output terminal 660 of the twin device $Q_2$ (as indicated by the chained line in FIG. 6). In the illustrated embodiment 600 however, it will be noted that the input terminal 640 is connected instead to a precision voltage divider which produces the desired voltage $V_{DD}$. In some circuits it is not necessary to have a precise operating current output $I_2$ except at a particular voltage state wherein the output voltage $V_{D2}$ of the twin device $Q_2$ is equal to a predetermined (desired) voltage $V_{DD}$. In FIG. 5 for example, the steady state input voltage $V_{in}$ of the VCO 550 (after lock-in of the CLOCK and DATA phases) is often set equal to one-half of the supply voltage $V_{cc}$. This means that the steady state output voltages of the p-channel FET 530 and n-channel FET 540 will also be equal to one-half of the supply voltage $V_{cc}$. Consequently, if the biasing circuit 600 of FIG. 6 is used to produce at least one of the gate biasing voltages, $V_{G1}$ and $V_{G2}$, for the FETs 530 and 540 shown in FIG. 5, the desired voltage $V_{DD}$ can be set equal to one-half of the supply voltage $V_{cc}$ by means of a precision voltage divider 650 without need for direct connections between the input terminal 640 of the difference amplifier $U_1$ and the drain terminals $D_1$ and $D_2$ of the FETs 530 and 540. It should be appreciated, that aside from eliminating a direct connection from the input terminal 640 to the output terminal 660 of the twin operating device $Q_2$ shown in FIG. 6, there is the added benefit that the input lead 640 of the difference amplifier $U_1$ may be made very short by locating the voltage divider 650 close to the difference amplifier $U_1$ so the danger of undesirable noise coupling into the input terminal 640 is minimized.

The difference amplifier $U_1$, exemplary device $Q_1$ and precision voltage source 650 are preferably formed together on the integrated circuit chip near a peripheral edge of the semiconductor substrate 602. The current reference element 610 is preferably an external precision resistor that is connected to the biasing circuit 600 through a substrate connection pad 615. An opposed end of the external precision resistor 610 may be connected to a voltage supply ($V_{cc}$) pad 605 of the integrated circuit. The reference current $I_0$ through the precision resistor 610 can then be calculated to be $I_0 = (V_{cc} - V_{DD})/R_{ex}$, where $R_{ex}$ is the resistance of the external precision resistor 610.

Figure 2:
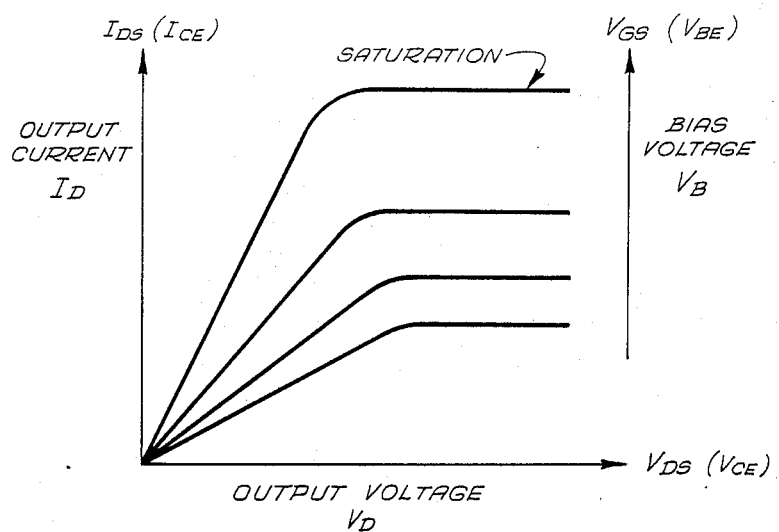
FIG. 2 is a graph showing a typical relationship between the output current of an active device and the applied bias and output voltages of such a device.
Figure 3:
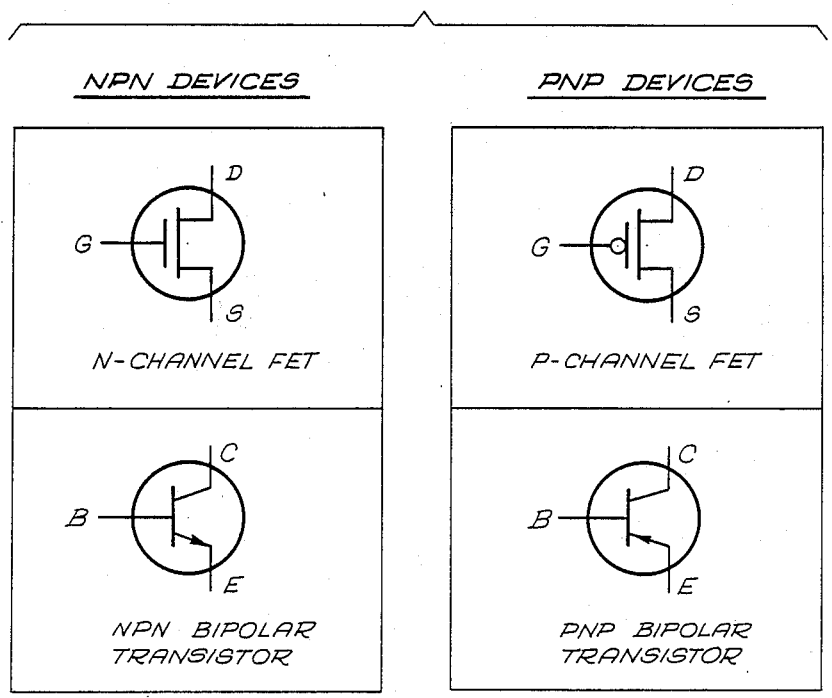
FIG. 3 illustrates schematic symbols used to represent various active devices.

Numerous variations will present themselves once the concept of FIG. 6 is understood. If the twin operating device $Q_2$ is operating in saturation (FIG. 2) then the magnitude of its output current $I_2$ will be generally insensitive to small variations in the output voltage $V_{D2}$ across the output terminals of $Q_2$. The exemplary device $Q_1$ will be operating at a corresponding saturation point (same constant bias level $V_{GS} = V_{B1}$) of its characteristic curve (FIG. 2). Small differences between the output voltage $V_{D1}$ of the exemplary device and the output voltage $V_{D2}$ of the operating device will create minor differences between the precision of the output currents flowing through each device. If these minor differences are acceptable for a particular circuit, there is no need to assure that $V_{D1}$ and $V_{D2}$ are precisely matched. The output current $I_2$ of the exemplary device will be approximately equal to or a scaled replica of the output current $I_1$ through the exemplary device.

Figure 7:
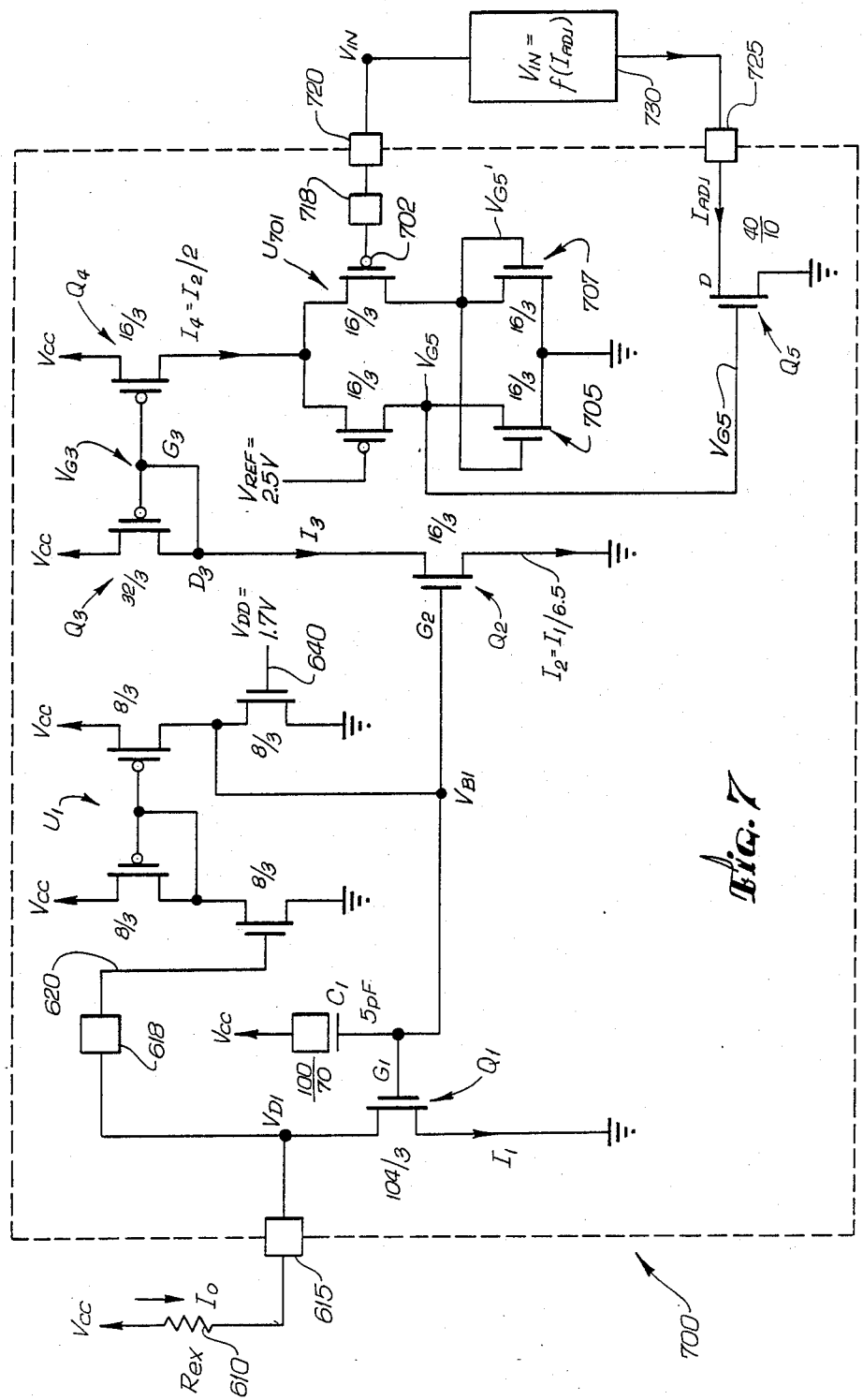
FIG. 7 is a schematic diagram of an integrated circuit chip into which a second embodiment of the present invention is incorporated.

FIG. 7 shows an integrated circuit chip 700 in which an exemplary n-channel FET $Q_1$ and a twin n-channel FET $Q_2$ are operated at or near such an output-voltage insensitive saturation region of their respective characteristic curves. An external current reference element 610 having a precisely known resistance $R_{ex}$ is connected to internal components of the chip 700 through a first substrate contact pad 615. The output current $I_1$ through the exemplary device $Q_1$ will be substantially equal to the current $I_0$ passing through the current reference 610 by virtue of Kirchhoff's current law. The output voltage $V_{D1}$ across $Q_1$ is coupled through an electrostatic input protection pad 618 to a first input 620 of a difference amplifier $U_1$. The difference amplifier $U_1$ senses the voltage $V_{D1}$ and compares it with a desired voltage $V_{DD}$ (which in this case is set equal to 1.7 V) and outputs a biasing level $V_{B1}$ to a gate terminal $G_1$ of the exemplary device $Q_1$ to drive the output voltage $V_{D1}$ of $Q_1$ toward the desired voltage $V_{DD}$. An integrated circuit capacitor $C_1$ is connected to the gate $G_1$ of $Q_1$ to inhibit undesirable oscillation. The biasing level $V_{B1}$ is also coupled to a second gate $G_2$ of a twin operating device $Q_2$. The twin device $Q_2$ will be operating along the same bias curve $V_{GS} = V_{B1}$ as the exemplary device $Q_1$. Since generally speaking, the output current $I_D$ (FIG. 2) of an active device changes very little relative to output voltage $V_D$ at or near saturation, the output current $I_2$ through $Q_2$ will be determinable, within specifiable tolerances, to be approximately equal to or to be approximately a scaled replica of the output current $I_1$ flowing through the exemplary device $Q_1$. The exemplary device $Q_1$ has a width/length dimension of 104/3 in the illustrated IC 700. The twin n-channel device $Q_2$ has a dimension of 16/3. Accordingly, the current through the twin device $Q_2$ will be approximately $I_2 = I_1/6.5$.

Figure 4:
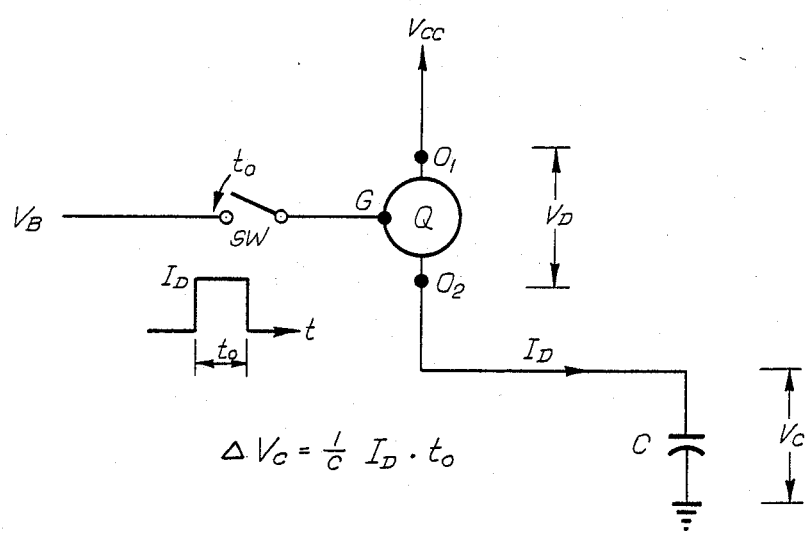
FIG. 4 is a schematic diagram of a typical timing circuit.

A p-channel FET $Q_3$ is connected in series with the n-channel twin device $Q_2$ in FIG. 7. Although $Q_3$ is dissimilar to $Q_2$ and $Q_1$, its output current $I_3$ is forced to be substantially equal to the output current $I_2$ of $Q_2$ by virtue of Kirchhoff's current law. The gate voltage $V_{G3}$ of $Q_3$ is self-adjusted to conform with its output current $I_3$ by typing the gate terminal $G_3$ to the drain terminal $D_3$. The same gate voltage, $V_{G3}$ is applied to the gate of a half-sized p-channel device $Q_4$. The current through $Q_4$, which is $I_4 = I_2/2$, is reflected into an output n-channel FET $Q_5$ through a difference amplifier $U_{701}$. When the difference amplifier $U_{701}$ is balanced, that is, when the input voltage $V_{in}$ coupled to one of its inputs 702 through an input pad 720 and an electrostatic protection pad 718, is equal to an internally provided reference voltage $V_{REF} = 2.5$ V then the current $I_4$ supplied by the p-channel device $Q_4$ is split symmetrically through mirror image symmetrical halves of $U_{701}$. Half of the current $I_4$ flows through an n-channel device 707 at the right side of $U_{701}$ and the other half flows through a second n-channel device 705 at the left side of the amplifier $U_{701}$. The gate of the right side n-channel device 707 is tied to its own drain so the voltage thereat $V_{GS}'$ self adjusts for the current $I_4/2$. The self adjusted gate voltage $V_{GS}'$ is applied to the gate of the opposing left n-channel FET 705. The gate of the n-channel output FET $Q_5$ is cross coupled to the drain of the left side n-channel FET 705 to create a mirror gate voltage $V_{G5}$ thereat such that the output current $I_{ADJ}$ through $Q_5$ is determinable on the basis of device geometry (width/length dimensions). A current adjusting pad 725 is connected to the drain of $Q_5$. The pad 725 may be connected for example, to a current/voltage feedback system 730 which changes the input voltage $V_{in}$ according to the magnitude of the output current $I_{ADJ}$. ($V_{in}$ is a function of $I_{ADJ}$, $V_{in} = f(I_{ADJ})$.) One example of such a current/voltage converting system 730 is the earlier described charge integrating capacitor $C_1$ as shown in FIGS. 4 and 5. When the input voltage $V_{in}$ at pad 720 rises above $V_{REF} = 2.5$V, less current will flow through the right side (FET 707) of the amplifier $U_{701}$ and more current will be reflected into the left side FET 705. The drain voltage $V_{GS}'$ of the right side n-channel FET 707 will drop as a result. The mirror voltage $V_{G5}$ across the left-side FET 705 will consequently rise causing an increase in the current $I_{ADJ}$ through $Q_5$. Conversely, when $V_{in}$ drops below 2.5 V, the current $I_{ADJ}$ through $Q_5$ will decrease through an opposing sequence of events. At $V_{in}=2.5$ V, the output current through $Q_5$ will be $I_{ADJ}=(40/10).(3/16).I_4/2$ because $V_{G5}'=V_{G5}$ and the current through the right FET 707 is mirrored into the output FET $Q_5$. This current may be used to precisely control the voltage of a charge accumulating capacitor such as $C_I$ of FIGS. 4 and 5.

Figure 8:
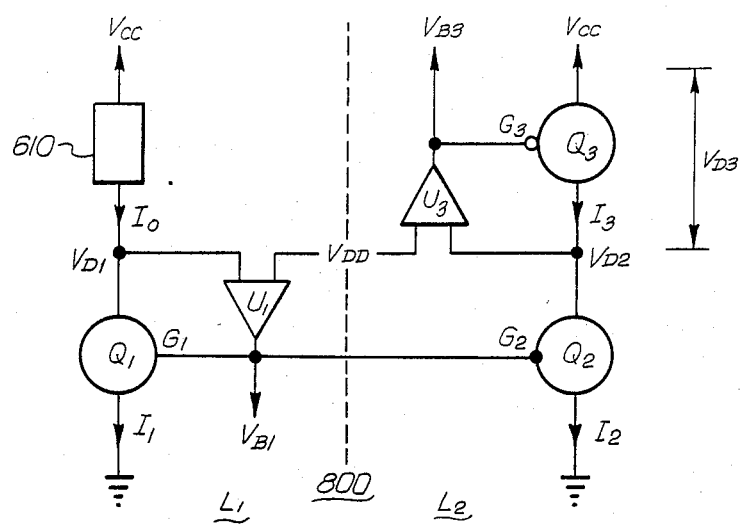
FIG. 8 is a schematic diagram of a third embodiment.

A two legged embodiment 800 is shown in FIG. 8. A dissimilar active device $Q_3$ is placed in series with the twin $Q_2$ of the exemplary device $Q_1$. An open circle is indicated at the gate $G_3$ of the third active device $Q_3$ to indicate that it is not a twin of the other two active devices, $Q_1$ and $Q_2$. Since $Q_3$ is in series with $Q_2$, its output current $I_3$ will be substantially equal to the output current $I_2$ of the second device $Q_2$. A difference amplifier $U_3$ is connected to the gate $G_3$ of the dissimilar device $Q_3$ to drive the output voltage $V_{D2}$ of $Q_2$ equal to a desired device $V_{DD}$. Since the output voltage $V_{D2}$ of $Q_2$ is known to be equal to the output voltage $V_{D1}$ of the exemplary device $Q_1$, the output current $I_2$ of the twin device $Q_2$ will be scaled replica $(I_2=W_2/L_2.L_1/W_1.I_1)$ of the output current $I_1$ of $Q_1$ regardless of whether $Q_1$ and $Q_2$ are in saturation or operating at an unsaturated level where output current is sensitive to output voltage variations. The output voltage $V_{D3}$ of the dissimilar device $Q_3$ will be known since the voltages $V_{cc}$ and $V_{D2}$ are also known. The bias voltage $V_{B3}$ developed at the gate $G_3$ of the dissimilar device $Q_3$ is precisely the voltage necessary for driving twins of $Q_3$ to produce scaled replicas of the current $I_3$ when the respective output voltages of $Q_3$'s twins are equal to $V_{D3}$. The desired voltage $V_{DD}$ is preferably made exactly one-half $V_{cc}$ so that $V_{D2}=V_{D3}$.

Referring to both FIG. 5 and FIG. 8, it will be apparent that in a case where $Q_3$ is a twin of the p-channel FET 530 and $Q_2$ is a twin of the n-channel FET 540, then the respective gate voltages $V_{B3}$ and $V_{B1}$ developed at the gates of $Q_3$ and $Q_2$, may be used to bias the gates of the complementary FETs 530 and 540 of FIG. 5 (by setting $V_{G1}=V_{B3}$ and $V_{G2}=V_{B1}$). In such a case, the sink and source currents provided by the complementary FETs, 530 and 540, in the phase-locking system 500 will be identical when $V_{in}=V_{DD}$. The output of the charge integrating capacitor $C_I$ will remain at this voltage $V_{in}=V_{DD}$ once the CLOCK signal is locked into phase with the DATA signal because the source current will be substantially identical to the sink current.

Referring to FIG. 8 alone, it will be noted that the right leg $L_2$ of the two legged embodiment 800 is merely an upside-down version of the left leg $L_1$ with the twin active device $Q_2$ substituted for the current reference element 610. It will be understood that the arrangement can be repeated to produce biasing voltages for additional devices on the integrated circuit chip that are dissimilar both to $Q_1$ and $Q_3$. Although mentioned briefly earlier, it should also be understood that the difference amplifiers $U_1$ and $U_3$ are formed with relatively high input impedances so that the series current relations $I_1=I_o$ and $I_3=I_2$ in respective legs, $L_1$ and $L_2$, will be substantially unaffected by the input impedances of amplifiers $U_1$ and $U_3$.

Figure 9:
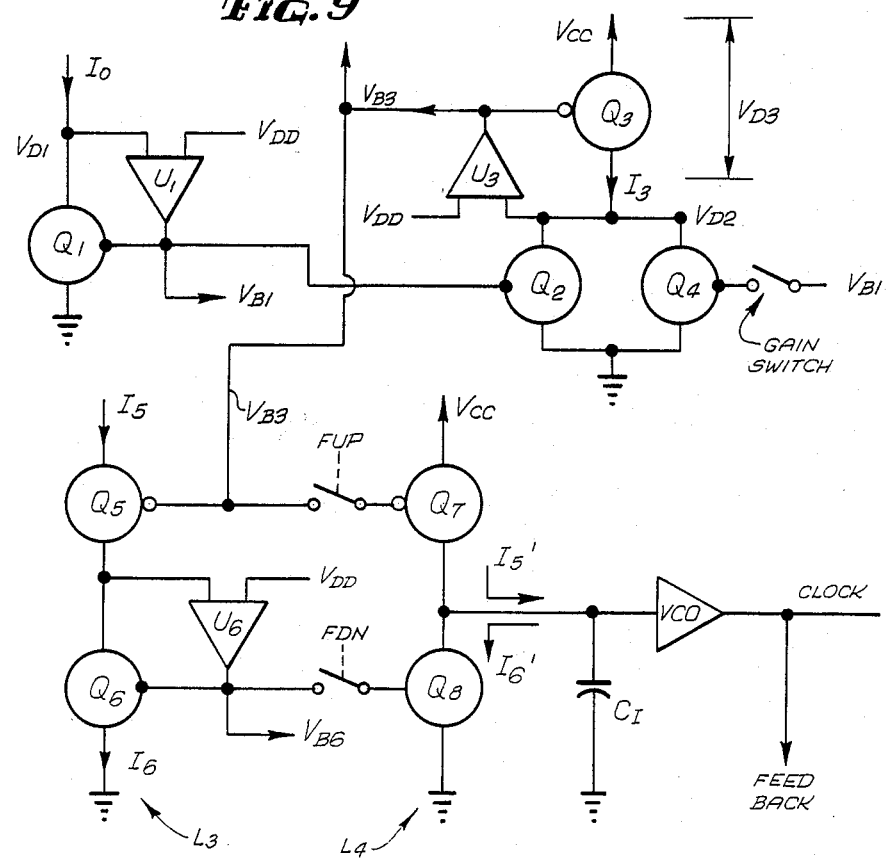
FIG. 9 is a schematic diagram of a fourth embodiment.

In FIG. 9, a second twin device $Q_4$ is controllably connected in parallel with $Q_2$ by means of a gain switch to increase the output current $I_3$ of the dissimilar device $Q_3$. When the gain switch is closed, the output $V_{B3}$ of the difference amplifier $U_3$ changes to accommodate the increased device current $I_3$. This increase is reflected into a third leg $L_3$ of the circuit shown in FIG. 9. A new biasing signal $V_{B6}$ is generated by a feedback loop comprised of a third difference amplifier $U_6$ and an active device $Q_6$. $V_{B6}$ and $V_{B3}$ are respectively fed into the gates of twin devices $Q_8$ (n-channel) and $Q_7$ (p-channel) to produce matched sink and source currents, $I_6$, and $I_{5'}$. The system gain may be switched from a low gain mode to a high gain mode simply by activating the gain switch to increase the output currents of devices $Q_7$ and $Q_8$. $I_{5'}$ and $I_{6'}$ will remain precisely matched in either mode.

Figure 10:
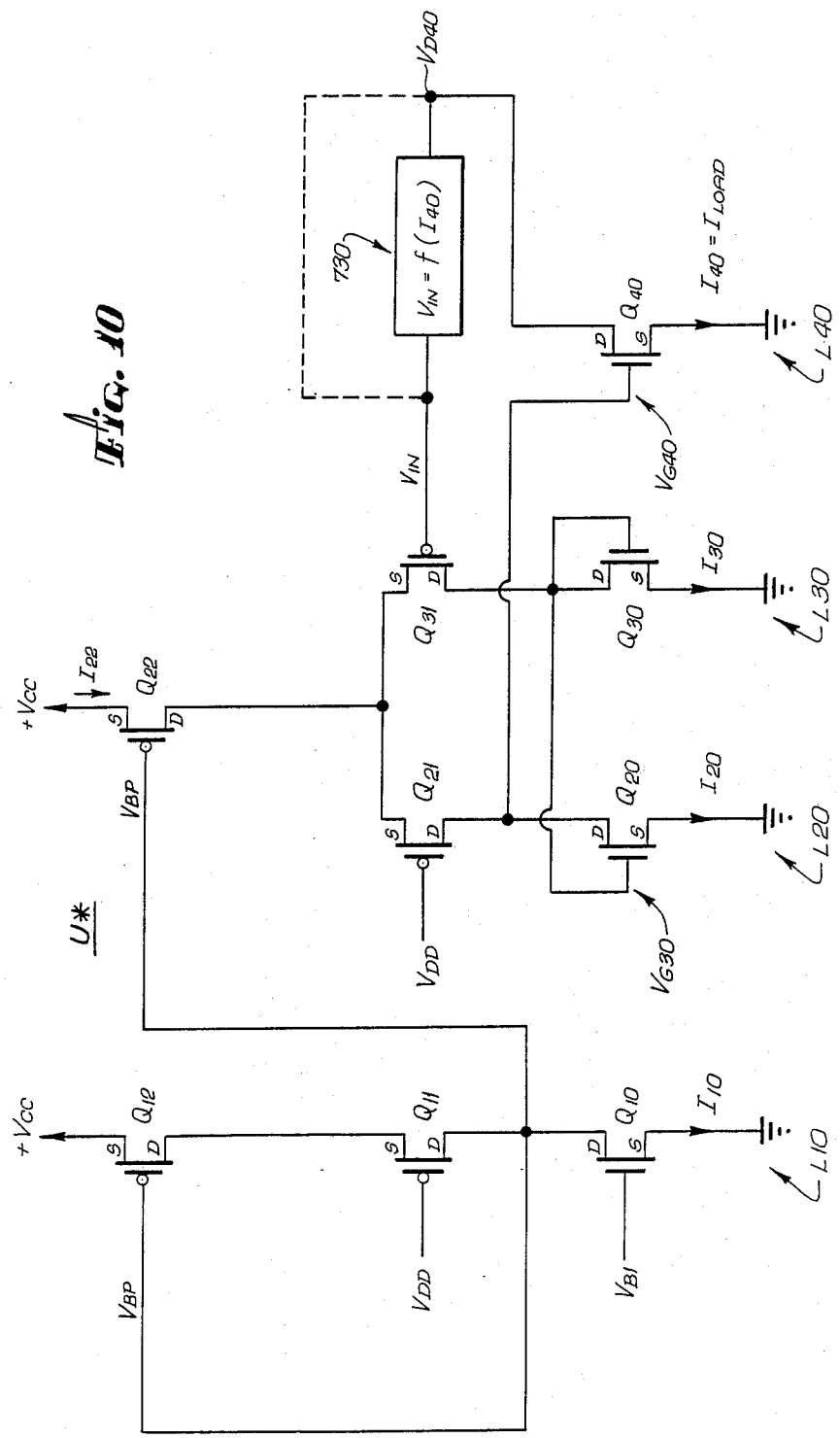
FIG. 10 is a diagram of a self-reflecting amplifier.

Referring to FIGS. 6, 8 and 9, it will be noted that the purpose of the difference amplifiers $U_1$, $U_3$ and $U_6$ is to drive an output voltage $V_D$ of an active device such that the output $V_D$ will be substantially equal to a desired voltage $V_{DD}$. FIG. 10 shows a special amplifier $U^*$ which is devised for this purpose. The special amplifier $U^*$ is referred to herein as a self-reflecting amplifier. The self-reflecting amplifier $U^*$ comprises a current reference leg $L_{10}$ through which a first current $I_{10}$ is controllably passed preferably using the concept of the above disclosed precision biasing circuit. Namely, a biasing voltage $V_{B1}$ is applied to an n-channel device $Q_{10}$ in the reference leg $L_{10}$ to establish the magnitude of the first current $I_{10}$. The same current $I_{10}$ flows through two p-channel devices, $Q_{11}$ and $Q_{12}$ in the reference leg $L_{10}$. The gate of $Q_{11}$ is tied to a desired voltage $V_{DD}$. The gate of $Q_{12}$ is connected to the drain of $Q_{10}$ to produce a self-adjusting gate voltage $V_{BP}$ that is necessary for allowing the current $I_{10}$ to pass through $Q_{12}$. The self-adjusted gate voltage $V_{BP}$ is brought to another p-channel device $Q_{22}$ that is shared by two symmetrical legs, $L_{20}$ and $L_{30}$, of the difference amplifier $U^*$. For simplicity of explanation, it will be assumed that $Q_{22}$ is double dimensioned so a current $I_{22}$ equal to twice the magnitude of $I_{10}$ passes through the uppermost device $Q_{22}$. The current $I_{22}$ splits into two streams $I_{20}$ and $I_{30}$ each equal to $I_{10}$. The two streams $I_{20}$ and $I_{30}$ pass through the symmetrical leg portions $L_{20}$, $L_{30}$ of the amplifier $U_8$. Symmetry occurs because a p-channel FET $Q_{21}$ in the left leg $L_{20}$ is a mirror of a right-side twin device $Q_{31}$ and a lower left-side n-channel FET $Q_{20}$ is a mirror of a right-side lower device $Q_{30}$. Each of the symmetrical legs, $L_{20}$ and $L_{30}$, ($Q_{22}$ is shared by both legs) is a mirror image of the first leg $L_{10}$ that is; $Q_{22}$ is a twin of $Q_{12}$; $Q_{11}$ is a twin of $Q_{21}$ and $Q_{31}$; and $Q_{10}$ is a twin of $Q_{20}$, $Q_{30}$. Any imbalance between the gate voltages of $Q_{21}$ and $Q_{31}$ will result in a counter-balancing adjustment of the current streams $I_{20}$ and $I_{30}$. A current-controlling active device $Q_{40}$ is cross-coupled to the gate of $Q_{31}$ and the drain of $Q_{20}$. It is to be noted that $Q_{40}$ is a twin of $Q_{10}$, $Q_{20}$ and $Q_{30}$. The drain of $Q_{40}$ may be coupled to $Q_{31}$ through a feedback system 730 which produces a voltage $V_{in}=f(I_{40})$ at the gate of $Q_{31}$ or may be connected directly (dotted line) to the gate of $Q_{31}$ in which case the voltage $V_{in}$ at the gate of $Q_{31}$ will be equal to the output voltage $V_{D40}$ of the current-controlling device $Q_{40}$. If the gate voltage $V_{in}$ of $Q_{31}$ shifts to be less than the gate voltage $V_{DD}$ of $Q_{21}$, more current will flow through the right-side device $Q_{31}$. A corresponding decrease in the current stream $I_{20}$ through the complementary left symmetrical leg $L_{20}$ will result. The increased right-side current flow of $I_{30}$ will force the drain voltage of $Q_{30}$ upward. A corresponding downward shift will take place in the drain voltage $V_{G40}$ of $Q_{20}$. This downward shift of $V_{G40}$ is coupled to the gate of $Q_{40}$ resulting in less current flow through $Q_{40}$. The drain of $Q_{40}$ is coupled to the gate of $Q_3$, in such a manner that $V_{in}$ will rise (in the case of $V_{in} > V_{DD}$) to match $V_{DD}$. The reverse situation will occur if $V_{in}$ is greater than $V_{DD}$.

In the case where the drain of $Q_{40}$ is connected directly to the gate of $Q_{31}$, the output voltage $V_{D40}$ of the current-controlling device $Q_{40}$ will be urged equal to the gate voltage $V_{DD}$ of $Q_{21}$. The gate voltage $V_{G40}$ of $Q_{40}$ will be substantially equal to the gate voltage $V_{G30}$ of $Q_{30}$ when U* is in the balanced condition. Since the right symmetrical leg $L_{30}$ is almost a mirror image of the reference leg $L_{10}$ in this condition ($V_{G30}$ will be nearly identical to $V_{B1}$) the current $I_{30}$ through $Q_{30}$ will be a close replica of the current $I_{10}$ through the reference leg $L_{10}$. $I_{30}$ is reflected into $Q_{40}$ by the principle of current mirroring so $I_{40}$ will be a close replica of $I_{10}$ as well.

Referring to FIG. 7 it can be seen that a similar principle is used in the amplifier $U_{701}$ of the chip 700. U* differs from $U_{701}$ in the fact that the desired voltage $V_{DD}$ is replicated in the reference leg $L_{10}$ while $U_{701}$ operates with a 1.7 V voltage forced across Q1. The advantage of the U* amplifier (FIG. 10) is that not only does each mirror-image symmetrical leg $L_{20}$, $L_{30}$ force a balancing of $V_{in}$ to $V_{DD}$ but that the precision current $I_{10}$ through the leg $L_{10}$ is replicated with better precision through $Q_{40}$ because $Q_{40}$ is mirror-image wise symmetrical with $Q_{10}$, $Q_{20}$ and $Q_{30}$ while $Q_{22}$ is mirror-image wise symmetrical with $Q_{12}$ and moreover $Q_{21}$, $Q_{31}$ are mirror-image wise symmetrical with $Q_{11}$. This causes the current mirroring of $I_{10}$ into the right leg $L_{30}$ to be more precise. That is, the circuit of FIG. 10 does not have to rely on $Q_{22}$ being in a "saturation" state for its current precision, it can rely on the fact that $Q_{22}$ is mirror-image wise symmetrical with $Q_{12}$ (the output voltage of $Q_{12}$ is "reflected" across $Q_{22}$) so $V_{BP}$ will cause $I_{22}$ to be a scaled replica of $I_{10}$. When $V_{D40}$ is balanced with $V_{DD}$, the load current $I_{LOAD} = I_{40}$ through $Q_{40}$ will be in a scaled replica of the reference current $I_{10}$. The self-reflecting amplifier U* can be substituted for amplifiers $U_3$ and $U_6$ in FIG. 9. A conventional difference amplifier is preferably used for $U_1$ to generate the voltage $V_{B1}$ which controls the current $I_{10}$ in the first leg $L_{10}$ of the self-reflecting amplifier U*.

While a number of variations have been described above, many additional embodiments will become apparent to those skilled in the art once the spirit of the present invention is understood. Accordingly, the scope of the present invention is not limited merely to the specific embodiments described above but rather defined by the appended claims and equivalents thereof.

We claim:

1. A biasing circuit for generating a reference bias level that can be applied to a first gate terminal of an active operating device, where the operating device is integrally formed in an integrated circuit and first gate terminal controls the magnitude of a first current passing through the operating device by way of first and second output terminals of the operating device, an operating device output voltage being developed between the first and second output terminals, the biasing circuit comprising:

an active exemplary device which is integrally formed in the same integrated circuit together with the operating device, wherein the exemplary device includes a second gate terminal and third and fourth output terminals, the second gate terminal controlling the magnitude of a second current passing through the exemplary device by way of the third and fourth output terminals and the magnitude of an exemplary device output voltage developed between the third and fourth output terminals, the exemplary device being formed in the integrated circuit such that the exemplary device operating characteristics, characterized by the relationship between the second current and the exemplary device output voltage, are substantially a copy of, or a replica scaled in accordance with a predetermined scaling of, the operating device operating characteristics, characterized by the relationship between the first and current and the operating device output voltage;

reference means, connected in series with the exemplary device, for forcing the magnitude of the second current to be equal to a predetermined reference value;

voltage establishing means for establishing a desired voltage;

control means, coupled to the voltage establishing means and the exemplary device, for sensing the exemplary device output voltage developed between the third and fourth output terminals, comparing the sensed exemplary device output voltage to the desired voltage, and supplying a bias level to the second gate terminal to drive the exemplary device output voltage toward the desired voltage; and bias level duplicating means, connected to the operating device and the control means, for applying to the first gate terminal a duplicate of the bias level supplied to the second gate terminal, thereby creating a condition wherein the magnitude of the first current will be substantially a precision copy or a precisely scaled replica of the magnitude of the second current when an operating output voltage, substantially equal to the exemplary device output voltage, develops between the first and second output terminals of the operating device;

wherein the bias level duplicating means includes a switching means for applying the duplicate bias level to the operating device for a first time duration.

2. A biasing circuit according to claim 1 wherein the reference means comprises an external precision resistor having a resistance value of a preselected precision, for controlling the precision of the first current magnitude.

3. A biasing circuit according to claim 1 wherein the reference means comprises a connection pad which is integrally formed in the integrated circuit and current reference means located externally of the integrated circuit and connected to the connection pad, where the current reference means is provided for controlling the magnitude of the second current.

4. A biasing circuit according to claim 1 wherein the voltage establishing means comprises voltage divider means, integrally formed in the integrated circuit, for precisely setting the desired voltage equal to a predetermined multiple of a reference voltage supplied to the voltage divider means.

5. A biasing circuit according to claim 1 wherein the control means includes a difference amplifier having first and second input terminals for detecting a difference between the exemplary output voltage and the desired voltage, the first input terminal being coupled to the third output terminal and the second input terminal being coupled to the voltage establishing means so as to be supplied with a voltage level establishing the desired voltage, the difference amplifier further having a biasing output which is connected to the second gate terminal for supplying the bias level thereto.

6. A biasing circuit according to claim 1 further comprising an active dissimilar device which is not a precision copy or precisely scaled replica of the exemplary device, wherein the operating device is connected in series with the dissimilar device such that substantially all or a precisely scaled portion in accordance with a predetermined second scaling factor of the first current passing through the operating device will flow through the dissimilar device so as to cause the magnitude of a third current flowing through the dissimilar device to be substantially a precision copy or precisely scaled replica of the magnitude of the second current.

7. A biasing circuit according to claim 1 wherein the integrated circuit further comprises one or more additional operating devices, each of which is a twin of the exemplary device and each of which has a current control gate for controlling the magnitude of a current passing through its respective additional operating device; and wherein the bias level duplicating means is operatively coupled to the one or more additional operating devices for applying respective duplicates of the bias level to the control gates of the one or more additional operating devices.

8. A biasing circuit according to claim 1 wherein the control means includes insulated gate means, coupled to the exemplary device, for insulatively sensing the exemplary output voltage.

9. A biasing circuit according to claim 1 wherein the voltage establishing means includes voltage having means for setting the desired voltage equal to one half of an applied power supply voltage.

10. A biasing circuit according to claim 2 wherein: the integrated circuit has first and second voltage supply nodes across which a supply voltage is applied, the precision resistor means has a first end connected to the first voltage supply node and a second end connected to the third output terminal, and the fourth output terminal is connected to the second voltage supply node so that the voltage across the first and second ends of the precision resistor means will be substantially equal to the difference between the voltage of the first voltage supply node and the voltage of the third output terminal.

11. A biasing circuit according to claim 5 wherein the difference amplifier includes insulated gate means, coupled to the first input terminal, for insulatively detecting the exemplary output voltage.

12. A biasing circuit according to claim 5 wherein the integrated circuit has a power supply line and the voltage establishing means includes a voltage divider network having a first end connected to the power supply line of the integrated circuit and a second end connected to the second input terminal of the difference amplifier, where the second end of the voltage divider network is positioned close to the second input terminal of the difference amplifier so as to inhibit the introduction of noise into the second input terminal.

13. A biasing circuit for generating a reference bias level that can be applied to a first gate terminal of an active operating device, where the operating device is integrally formed in an integrated circuit and the first gate terminal controls the magnitude of a first current passing through the operating device by way of first and second output terminals of the operating device, an operating device output voltage being developed between the first and second output terminals, the biasing circuit comprising:

an active exemplary device which is integrally formed in the same integrated circuit together with the operating device, wherein the exemplary device includes a second gate terminal and third and fourth output terminals, the second gate terminal controlling the magnitude of a second current passing through the exemplary device by way of the third and fourth output terminals and the magnitude of an exemplary device output voltage developed between the third and fourth output terminals, the exemplary device being formed in the integrated circuit such that the exemplary device operating characteristics, characterized by the relationship between the second current and the exemplary device output voltage, are substantially a copy of, or a replica scaled in accordance with a predetermined scaling of, the operating device operating characteristics, characterized by the relationship between the first current and the operating device output voltage;

reference means, connected in series with the exemplary device, for forcing the magnitude of the second current to be equal to a predetermined reference value;

voltage establishing means for establishing a desired voltage;

control means, coupled to the voltage establishing means and the exemplary device, for sensing the exemplary device output voltage developed between the third and fourth output terminals, comparing the sensed exemplary device output voltage to the desired voltage, and supplying a bias level to the second gate terminal to drive the exemplary device output voltage toward the desired voltage; and bias level duplicating means, connected to the operating device and the control means, for applying to the first gate terminal a duplicate of the bias level supplied to the second gate terminal, thereby creating a condition wherein the magnitude of the first current will be substantially a precision copy or a precisely scaled replica of the magnitude of the second current when an operating output voltage, substantially equal to the exemplary device output voltage, develops between the first and second output terminals of the operating device wherein; each of the exemplary and operating devices includes a field-effect-transistor (FET).

14. A biasing circuit according to claim 13 wherein the bias level duplicating means includes a switching means for applying the duplicate bias level to the operating device for a first time duration.

15. A biasing circuit according to claim 13 further comprising
an operating voltage control means, coupled to at least one of the first and second output terminals of the operating device, for forcing the operating output voltage to be substantially equal to the exemplary output voltage.

16. A biasing circuit according to claim 15 wherein the operating voltage control means includes:
an active dissimilar device which is not a precision copy or precisely scaled replica of the exemplary device, and which has a third gate terminal and fifth and sixth output terminals, the dissimilar device being coupled in series with the operating device such that substantially all or a precisely scaled portion in accordance with a predetermined second scaling factor of the first current will flow through the dissimilar device by way of the fifth and sixth output terminals; and gate biasing means, coupled to the third gate terminal, for generating a driving bias at the third gate terminal to drive the dissimilar device to produce a dissimilar-device output voltage between the fifth and sixth output terminals that forces the operating output voltage between the first and second output terminals to become substantially equal to the exemplary output voltage.

17. A biasing circuit according to claim 16 further comprising:

an active dissimilar operating device provided integrally in the integrated circuit such that the dissimilar operating device has operating characteristics which are substantially a precision copy or a precisely scaled replica in accordance with a predetermined third scaling factor of the operating characteristics of the dissimilar device; wherein the dissimilar operating device has a fourth gate terminal for controlling the magnitude of a fourth current flowing through the dissimilar operating device; and gate bias duplicating means, coupled to the fourth gate terminal, for supplying a duplicate of the driving bias, applied to the third gate terminal, to the fourth gate terminal.

18. A biasing circuit according to claim 13 wherein the control means includes a self-reflecting amplifier, the self-reflecting amplifier being comprised of:

a current reference leg coupled to conduct a reference current of a predetermined magnitude therethrough, the reference leg including a first plurality of active devices coupled in series, one of the active devices in the first plurality having a first input to which the desired voltage is applied, a second of the active devices in the first plurality having a second input coupled to another active device in the first plurality so as to produce a self-adjusting biasing level at the second input which adjusts itself to allow the reference current to pass through the second active device of the first plurality;

a first symmetrical leg including a second plurality of active devices coupled in series; one of the active devices in the second plurality, that is a twin of the one active device in the first plurality, having a mirror-image first input to which the desired voltage is applied, a second active device in the second plurality, that is a twin of the second active device in the first plurality, having a mirror-image second input coupled to the second input of the reference leg to duplicate the self-adjusted biasing level developed at the second input;

a second symmetrical leg having a third plurality of active devices coupled in series; one of the active devices in the third plurality, that is a twin of the one active device in the second plurality, having a voltage sensing input connected to at least one of the third and fourth output terminals to sense the exemplary device output voltage; and current balancing means, coupled to the first and second symmetrical legs, for producing nearly-identical current streams in the first and second symmetrical legs such that the operating environment of the second active devices in the respective reference, first symmetrical and second symmetrical legs will be substantially similar when the device output voltage is substantially equal to the desired voltage applied at the first input and mirror-image first input of the self-reflecting amplifier.

19. A biasing circuit according to claim 13 wherein the operating device and exemplary device are designed to operate in a saturation portion of their respective operating characteristics at the respective magnitudes of the first and second currents and the desired voltage.

20. A biasing circuit according to claim 14 further comprising a capacitor, coupled to at least one of the first and second output terminals, for producing an integrated output voltage that is a function of the magnitude of the first current.

21. A biasing circuit according to claim 17 wherein the gate bias duplicating means includes a first switching means for supplying the duplicate driving bias to the fourth gate terminal for a first time duration.

22. A biasing circuit according to claim 21 further comprising
an active additional operating device that is a twin of the exemplary device and has a fifth gate terminal coupled to the bias level duplicating means so as to be supplied with a duplicate of the bias level supplied to the exemplary device;
wherein the additional operating device is coupled to the dissimilar operating device and the bias level duplicating means includes a second switching means for supplying the duplicate bias level to the fifth gate terminal for a second time duration.

23. A biasing circuit according to claim 22 wherein one of the dissimilar operating device and additional operating device supplies a source current to a load and the other of the dissimilar operating device and additional operating device withdraws a sink current from the load.

24. A magnitude control circuit for controlling the magnitude of first and second operating currents flowing respectively through first and second active operating devices of an integrated circuit by way of first and second output terminal pairs belonging respectively to the first and second operating devices, where the first and second operating devices have respective first and second operating gate terminals which can be biased to control the magnitudes of their respective first and second operating currents, and where precision control of the magnitude of the first and second operating currents is desired when predetermined first and second desired voltages develop respectively across the output terminal pairs of the first and second operating devices, each active operating device having an output voltage developed between its respective output terminal pairs, the magnitude control circuit comprising:

first active exemplary device, integrally formed in the integrated circuit to be a twin of the first operating device in terms of the relationship between their respective operating currents and output voltages, the first exemplary device having a first exemplary gate terminal and a first pair of exemplary output terminals, the first exemplary gate terminal controlling the magnitude of a first exemplary current flowing through the exemplary device by way of the first pair of exemplary output terminals and controlling the magnitude of a first exemplary output voltage between the first pair of exemplary output terminals;

a second active exemplary device, integrally formed in the integrated circuit to be a twin of the second operating device in terms of the relationship between their respective operating currents and output voltages, the second exemplary device having a respective second exemplary gate terminal and a second pair of exemplary output terminals, the second exemplary gate terminal controlling the magnitude of a second exemplary current flowing through the exemplary device by way of the second pair of exemplary output terminals and controlling the magnitude of a second exemplary output voltage between the second pair of exemplary output terminals, the second exemplary device being coupled to the first exemplary device such that the magnitude of the second exemplary current is a precise duplicate or a precisely scaled replica in accordance with a first predetermined scaling factor of the magnitude of the first exemplary current;

output voltage control means, coupled to the first exemplary gate terminal, for generating a first gate bias level to drive the magnitude of the first exemplary output voltage to be substantially equal to the magnitude of the first desired voltage;

first bias level duplicating means, coupled to the output voltage control means and the first operating gate terminal, for applying a duplicate of the first gate bias level to the first operating gate terminal for a first time duration such that, when an operating output voltage substantially equal to the first exemplary output voltage appears between the output terminal pair of the first operating device during the first time duration, the magnitude of the first operating current will be a precise duplicate or a precisely scaled replica in accordance with a second predetermined scaling factor of the first exemplary current; and second bias level duplicating means, coupled to the second operating gate terminal and the second exemplary gate terminal, for applying to the second operating gate terminal a duplicate of a second gate bias level applied to the second exemplary gate terminal.

25. A magnitude control circuit according to claim 24 wherein the second bias level duplicating means includes switching means for applying the duplicate second gate bias level to the second operating device for a second time duration.

26. A precision replication system for producing in an integrated circuit, an internal current whose magnitude is a substantially exact copy or exact scaled replica in accordance with a predetermined scaling multiplier of the magnitude of an external current flowing outside the integrated circuit, comprising:

an active operating device, integrally formed in the integrated circuit so as to be part of a first current path provided in the integrated circuit for conducting the internal current, where the operating device has first and second operating terminals for respectively inputting and outputting the internal and an operating gate for controlling the magnitude of the internal current;

an active exemplary device, integrally formed in the integrated circuit so as to be a substantially an exact copy or an exact scaled replica in accordance with a predetermined scaling factor of the operating device operating characteristics, including operating current and output voltage, where the exemplary device is coupled to receive and conduct the external current and the exemplary device is provided with first and second exemplary terminals for respectively inputting and outputting the external current and an exemplary gate for controlling the magnitude of an exemplary output voltage generated between the first and second exemplary terminals when the external current is conducted through the exemplary device;

first output voltage control means, coupled to the exemplary device, for comparing the exemplary output voltage with a predetermined reference voltage and supplying a first biasing signal to the exemplary gate to drive the exemplary output voltage to be substantially equal to the reference voltage; and bias duplicating means, coupling the first output voltage control means to the operating gate, for supplying a second bias signal, substantially equivalent to the first biasing signal, to the operating gate so that when an operating output voltage between the first and second operating terminals is substantially equal to the exemplary output voltage, the magnitude of the internal current will be substantially a precision copy or precisely scaled replica of the external current magnitude;

wherein the bias duplicating means includes a switching means for applying the duplicate bias level to the operating device for a first time duration period.

27. A precision replication system according to claim 26 further comprising one or more additional operating devices, each of which is integrally formed in the integrated circuit so as to be operating-characteristics-wise a substantially exact duplicate or an exact scaled replica of the exemplary device, wherein each additional operating device has a respective current controlling gate that is coupled to the bias duplicating means and wherein the bias duplicating means supplies corresponding duplicates of the first biasing signal to the current controlling gates of the additional operating devices.

28. A precision replication system according to claim 26 wherein the first output voltage control means includes first insulated gate means, coupled to the exemplary device, for insulatively sensing the exemplary output voltage.

29. A precision replication system according to claim 28 further comprising second voltage control means, coupled to the operating device, for forcing the operating output voltage to be substantially equal to the reference voltage.

30. A precision replication system according to claim 29 wherein the second voltage control means includes second insulated gate means, coupled to the operating device, for insulatively sensing the operating output voltage.

31. A precision replication system for producing in an integrated circuit, an internal current whose magnitude is a substantially exact copy or exact scaled replica in accordance with a predetermined scaling multiplier of the magnitude of an external current flowing outside the integrated circuit, comprising:

an active operating device, integrally formed in the integrate circuit so as to be part of a first current path provided in the integrated circuit for conducting the internal current, where the operating device has first and second operating terminals for respectively inputting and outputting the internal current and an operating gate for controlling the magnitude of the internal current;

an active exemplary device, integrally formed in the integrated circuit so as to be a substantially exact copy or an exact scaled replica in accordance with a predetermined scaling factor of the operating device operating characteristics, including operating current and output voltage, where the exemplary device is coupled to receive and conduct the external current and the exemplary device is provided with first and second exemplary terminals for respectively inputting and outputting the external current and an exemplary gate for controlling the magnitude of an exemplary output voltage generated between the first and second exemplary terminals when the external current is conducted through the exemplary device;

first output voltage control means, coupled to the exemplary device, for comparing the exemplary output voltage with a predetermined reference voltage and supplying a first biasing signal to the exemplary gate to drive the exemplary output voltage to be substantially equal to the reference voltage; and bias duplicating means, coupling the first output voltage control means to the operating gate, for supplying a second biasing signal, substantially equivalent to the first biasing signal, to the operating gate so that when an operating output voltage between the first and second operating terminals is substantially equal to the exemplary output voltage, the magnitude of the internal current will be substantially a precision copy or precisely scaled replica of the external current magnitude wherein the operating device and exemplary device each comprises a field effect transistor.

32. A precision current mirroring circuit for replicating the magnitude precision of a reference current flowing in the first part of an integrated circuit, in an operating current flowing in a second part of the integrated circuit, comprising:

an exemplary device having a variable controllable first resistance, the exemplary device being integrally disposed in the first part of the integrated circuit to conduct the reference current through the first resistance;

voltage sensing means, insulatively coupled to the exemplary device, for insulatively sensing an exemplary voltage drop developed across the first resistance when the reference current is conducted through the first resistance;

resistance controlling means, coupled to the voltage sensing means and the exemplary device, for supplying a control signal to the exemplary device to vary the first resistance so that the exemplary voltage drop is drive equal to a predetermined reference voltage;

an operating device having a variable controllable second resistance, the operating device being integrally disposed in the second part of the integrated circuit such that the operating device has control level versus resistance characteristics which are scaled twins of corresponding control level versus resistance characteristics of the exemplary device in accordance with the predetermined scaling factor and such that the operating current is conducted through the second resistance; and controllable signal duplicating means, coupled to the resistance controlling means and the operating device, for supplying a duplicate control signal to the operating device, substantially equivalent to the control signals supplied to the exemplary device, so that the magnitude precision of the reference current will be replicated in the magnitude of the operating current when an operating voltage drop, substantially equal to the exemplary voltage drop, develops across the second resistance;

wherein the control signal duplicating means includes a switching means for applying the duplicate control signal to the operating device for a first time duration.

33. A biasing circuit for generating a reference bias level that can be applied to a first gate terminal of an active operating device, where the operating device is integrally formed in an integrated circuit and the first gate terminal controls the magnitude of a first current passing through the operating device by way of first and second output terminals of the operating device, an operating device output voltage being developed between the first and second output terminals, the biasing circuit comprising:

an active exemplary device which is integrally formed in the same integrated circuit together with the operating device, wherein the exemplary device includes the second gate terminal and third and fourth output terminals, the second gate terminal controlling the magnitude of a second current passing through the exemplary device by way of the third and fourth output terminals and the magnitude of an exemplary device output voltage developed between the third and fourth output terminals, the exemplary device being formed in the integrated circuit such that the exemplary device operating characteristics, characterized by the relationship between the second current and the exemplary device output voltage, are substantially a copy of, or a replica scaled in accordance with a predetermined scaling of, the operating device operating characteristics, characterized by the relationship between the first current and the operating device output voltage;

reference means, connected in series with the exemplary device, for forcing the magnitude of the second current to be equal to a predetermined reference value;

voltage establishing means for establishing a desired voltage;

control means, coupled to the voltage establishing means in the exemplary device, for sensing the exemplary device output voltage developed between the third and fourth output terminals, comparing the sensed exemplary device output voltage to the desired voltage, and supplying a bias level to the second gate terminal to drive the exemplary device output voltage toward the desired voltage; and bias level duplicating means, connected to the operating device and the control means, for applying to the first gate terminal a duplicate of the bias level supplied to the second gate terminal, thereby creating a condition wherein the magnitude of the first current will be substantially a precision copy or a precisely scaled replica of the magnitude of the second current when an operating output voltage, substantially equal to the exemplary device output voltage, developed between the first and second output terminals of the operating device;

wherein the operating device and exemplary device are designed to operate in a saturation portion of their respective operating characteristics at the respective magnitudes of the first and second currents and the desired voltage.

34. A precision replication system for producing in an integrated circuit, an internal current whose magnitude is a substantially exact copy or exact scaled replica in accordance with a predetermined scaling multiplier of the magnitude of an external current flowing outside the integrated circuit, comprising:

an active operating device, integrally formed in the integrated circuit so as to be part of a first current path provided in the integrated circuit for conducting the internal current, where the operating device has first and second operating terminals for respectively inputting and outputting the internal current and an operating gate for controlling the magnitude of the internal current;

an active exemplary device, integrally formed in the integrated circuit so as to be a substantially exact copy or an exact scaled replica in accordance with a predetermined scaling factor of the operating device operating characteristics, including operating current and output voltage, where the exemplary device is coupled to receive and conduct the external current and the exemplary device is provided with first and second exemplary terminals for respectively inputting and outputting the external current and an exemplary gate for controlling the magnitude of an exemplary output voltage generated between the first and second exemplary terminals when the external current is conducted through the exemplary device;

first output voltage control means, coupled to the exemplary device, for comparing the exemplary output voltage with a predetermined reference voltage and supplying a first biasing signal to the exemplary gate to drive the exemplary output voltage to be substantially equal to the reference voltage; and bias duplicating means, coupling the first output voltage control means to the operating gate for supplying a second biasing signal, substantially equivalent to the first biasing signal, to the operating gate so that when an operating voltage between the first and second operating terminals is substantially equal to the exemplary output voltage, the magnitude of the internal current will be substantially a precision copy or precisely scaled replica of the external current magnitude wherein the operating device and exemplary device are field effect transistors designed to operate in a saturation portion of their respective operating characteristics at the respective magnitudes of the internal and external currents and the desired voltage.

35. A precision current mirroring circuit for replicating the magnitude precision of a reference current flowing in a first part of an integrated circuit, and an operating current flowing in a second part of the integrated circuit, comprising:

an exemplary device having a variable controllable first resistance, the exemplary device being integrally disposed in the first part of the integrated circuit to conduct the reference current through the first resistance;

voltage sensing means, insulatively coupled to the exemplary device, for insulatively sensing an exemplary voltage drop developed across the first resistance when the reference current is conducted through the first resistance;

resistance controlling means, coupled to the voltage sensing means and the exemplary device, for supplying a control signal to the exemplary device to vary the first resistance so that the exemplary voltage drop is driven equal to a predetermined reference voltage;

an operating device having a variable controllable second resistance, the operating device being integrally disposed in the second part of the integrated circuit such that the operating device has control level verses resistance characteristics which are scaled twins of corresponding control level verses resistance characteristics of the exemplary device in accordance with a predetermined scaling factor and such that the operating current is conducted through the second resistance; and control signal duplicating means, coupled to the resistance controlling means and the operating device, for supplying a duplicate control signal to the operating device, substantially equivalent to the control signal supplied to the exemplary device, so that the magnitude precision of the reference current will be replicated in the magnitude of the operating current when an operating voltage drop, substantially equal to the exemplary voltage drop, develops across the second resistance;

wherein each of the exemplary and operating devices includes a field-effect-transistor (FET).

36. A circuit as set out in claim 35 wherein the operating device and exemplary device are designed to operate in a saturation portion of their respective operating characteristics at the respective magnitudes of the reference current and the operating current and the desired voltage.

* * * * *

UNITED STATES PATENT AND TRADEMARK OFFICE
CERTIFICATE OF CORRECTION

PATENT NO. : 4,893,030
DATED : January 9, 1990
INVENTOR(S) : Gerald Shearer, et al.

It is certified that error appears in the above-identified patent and that said Letters Patent is hereby corrected as shown below:

In claim 1, at column 11, line 54, change "and first gate" to --and the first gate--; and at column 12, line 11, change "first and current" to --first current--.

In claim 9, at column 13, line 32, change "voltage having" to --voltage halving--.

In claim 18, at column 15, line 42, change "self-adjusting" to --self-adjusted--; and at line 57, change "having" to --including--.

Signed and Sealed this

Thirtieth Day of April, 1991

Attest:

HARRY F. MANBECK, JR.

*Attesting Officer*  *Commissioner of Patents and Trademarks*